United States Patent
Dai et al.

(10) Patent No.: US 8,656,618 B2
(45) Date of Patent: Feb. 25, 2014

(54) ELECTRONIC DEVICE FRAME

(75) Inventors: Bin Dai, ShenZhen (CN); Fa-Guang Shi, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 93 days.

(21) Appl. No.: 12/965,854

(22) Filed: Dec. 11, 2010

(65) Prior Publication Data

US 2012/0032567 A1    Feb. 9, 2012

(30) Foreign Application Priority Data

Aug. 4, 2010  (CN) .......................... 2010 1 0245077

(51) Int. Cl.
*A47G 1/06*    (2006.01)
*A47G 1/10*    (2006.01)
*A47G 1/08*    (2006.01)

(52) U.S. Cl.
USPC ................... 40/790; 40/791; 40/784; 40/785; 40/782; 40/739; 206/39; 206/454; 206/449

(58) Field of Classification Search
USPC ................... 40/790, 791, 784, 785, 782, 739; 206/39, 454, 449
See application file for complete search history.

(56) References Cited

U.S. PATENT DOCUMENTS

| | | | | |
|---|---|---|---|---|
| 5,097,953 | A * | 3/1992 | Gingras | 206/454 |
| 5,109,619 | A * | 5/1992 | Noggle | 40/737 |
| 5,255,458 | A * | 10/1993 | Piel | 40/758 |
| 5,974,714 | A * | 11/1999 | Jones | 40/768 |
| 6,615,526 | B2 * | 9/2003 | Pitcher et al. | 40/790 |

* cited by examiner

*Primary Examiner* — Syed A Islam
(74) *Attorney, Agent, or Firm* — Altis Law Group, Inc.

(57) ABSTRACT

A frame of an electronic device is a closed frame, and made of plastic material. The frame defines one or more deformation grooves at the corners of the frame to be expanded out or inwardly narrowed for changing a size of the frame. The frame includes a positioning portion and a support portion extending from an inner surface of the positioning portion. The deformation grooves are defined in the support portion.

5 Claims, 4 Drawing Sheets

ELECTRONIC DEVICE FRAME

CROSS-REFERENCE TO RELATED APPLICATIONS

This application is related to one co-pending U.S. patent application, which is: application Ser. No. 12/965,855, and entitled "ELECTRONIC DEVICE FRAME". Such application has the same assignee as the instant application and are concurrently filed herewith. The disclosure of the above-identified application is incorporated herein by reference.

BACKGROUND

1. Technical Field

The present disclosure relates generally to electronic device housings and, more particularly, to a frame of an electronic device of plastic material.

2. Description of Related Art

Electronic device frames are used for positioning and holding display panels, generally made of plastic material by injection molding.

However, the frames formed by injection molding often experience size errors as compared to a predetermined size, due to the limitations on manufacturing precision of the injection molds and the properties of the plastic material. If a formed actual size of a frame is smaller than the predetermined size of the frame, the frame may be scratched by the display panel in an assembly process of the electronic device. If a formed actual size of a frame is larger than the predetermined size of the frame, the display panel located in the frame may separate from the frame and fall down, thereby suffering damages.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
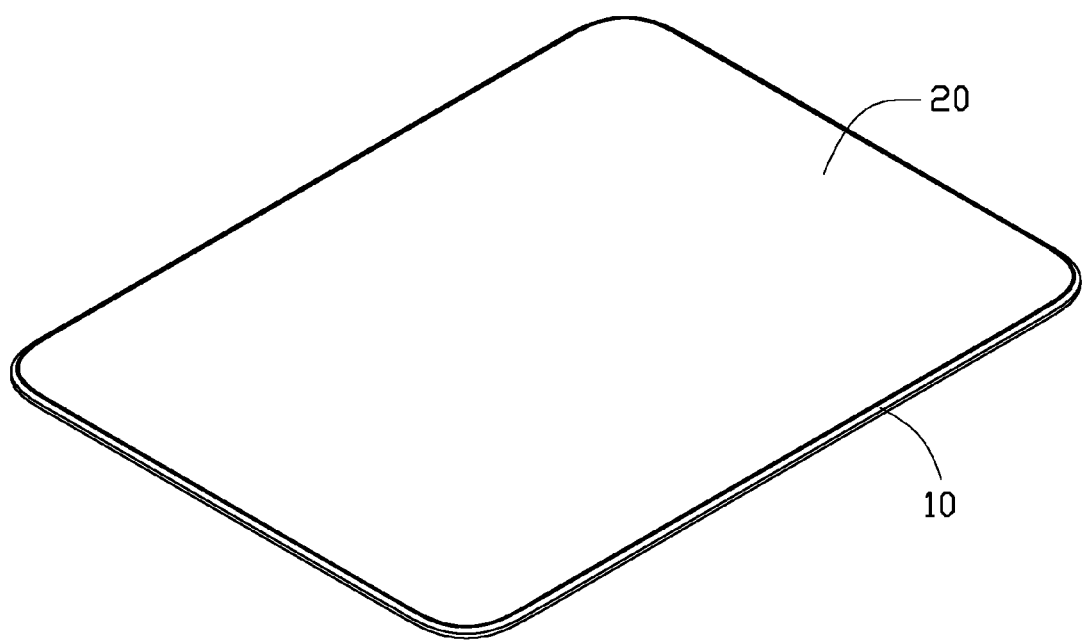
FIG. 1 is an isometric view of a first embodiment of a frame holding a glass sheet.
Figure 2:
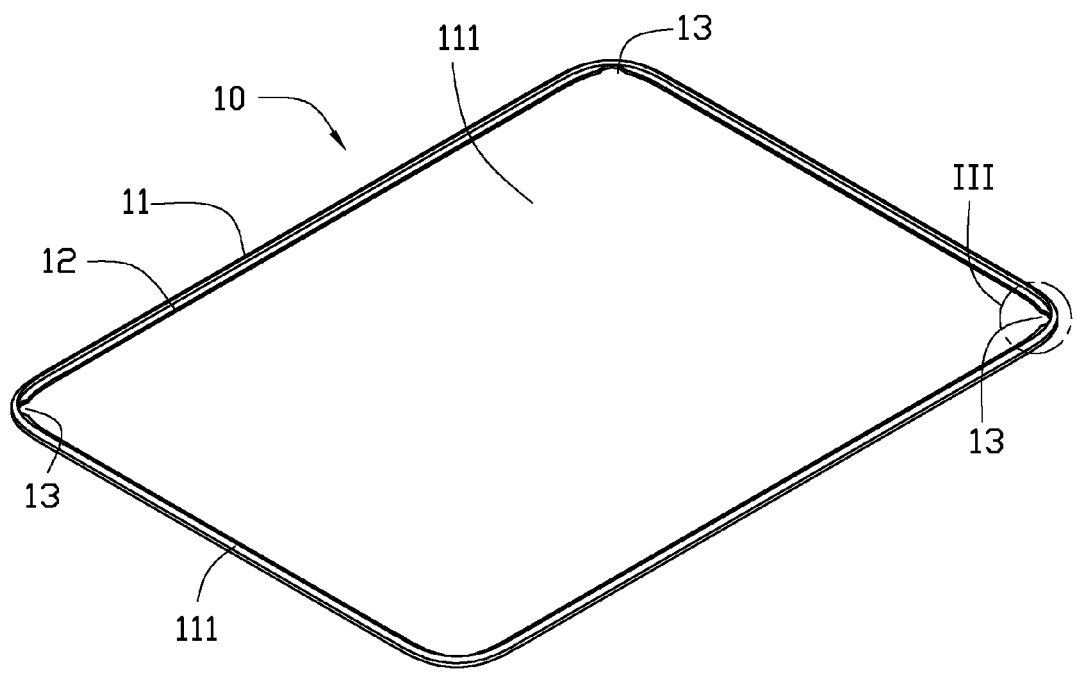
FIG. 2 is another isometric view of the frame of FIG. 1 viewed from another perspective.
Figure 3:
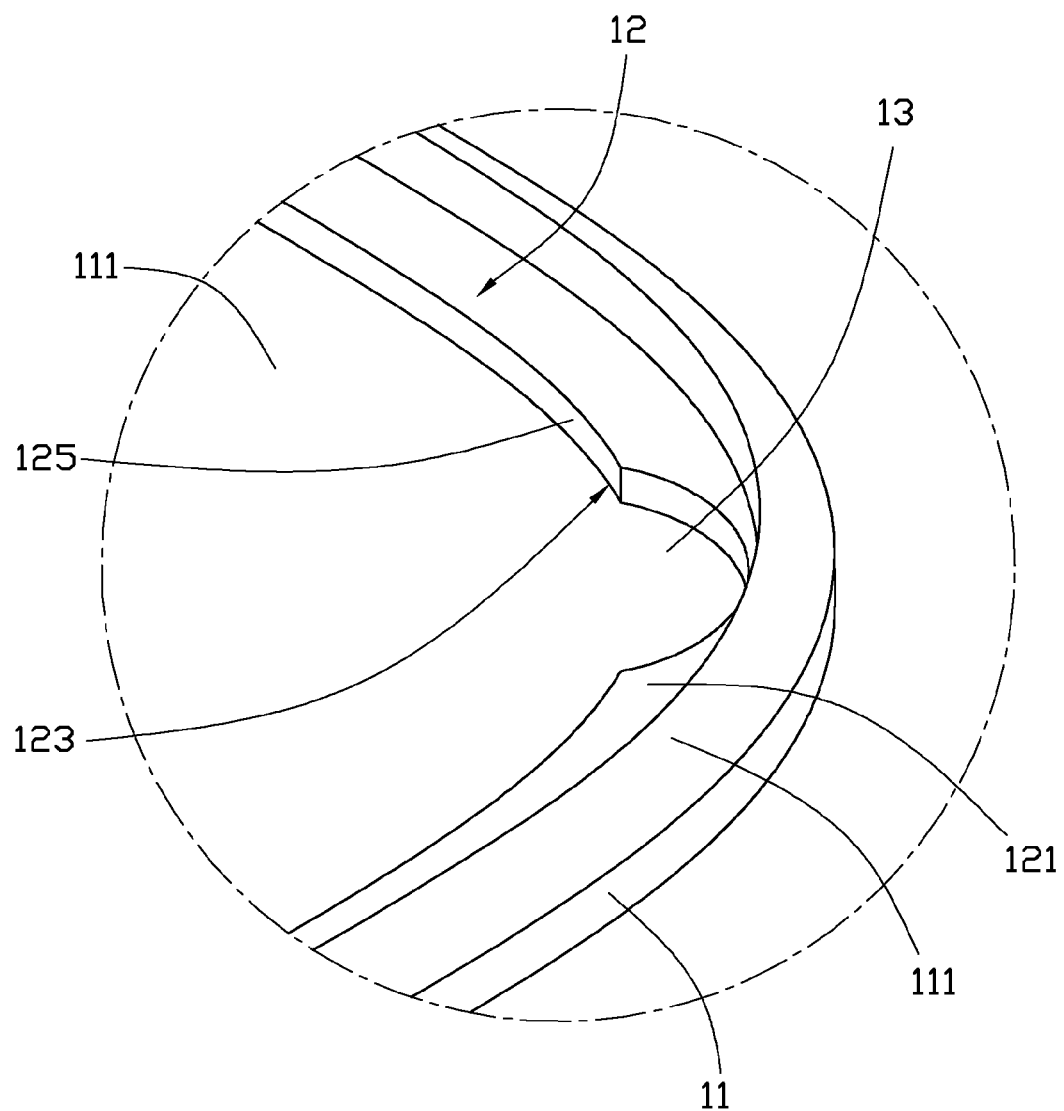
FIG. 3 is an enlarged view of a portion of the frame of FIG. 2 as denoted by a dashed circle labeled as III.

Referring to FIGS. 1 through 3, a first embodiment of a frame 10 of an electronic device (not shown) is used for mounting a glass sheet 20 of a display panel (not shown). The frame 10, integrally formed of plastic material, is a closed frame, and includes a positioning portion 11 and a support portion 12 extending from a bottom part of an inner surface of the positioning portion 11. The positioning portion 11 is frame-shaped, and has an opening 111 defined through a center thereof. A top part of an outer surface of the positioning portion 11 forms an angled surface 111. The support portion 12 comprises a first surface 121, a second surface 123 opposite to the first surface 121, and a side surface 125 connecting the first surface 121 and the second surface 123. The support portion 12 defines a plurality of deformation grooves 13. Each deformation groove 13 is depressed on the side surface 125 in the at least one corner of the support portion 12, and passes through the first surface 121 and the second surface 123 to be expanded or inwardly narrowed for changing a size of the frame 10. In the illustrated embodiment, the frame 10 is substantially rectangular. The frame 10 defines four deformation grooves 13 in the four corners of the frame 10, respectively. The deformation grooves 13 are a plurality of curved grooves.

In assembling the glass sheet 20 to the frame 10, if the frame 10 formed by the plastic material is smaller than a predetermined size, the glass sheet 20 can also be successfully assembled to the frame 20, because the deformation grooves 13 can be expanded to slightly enlarge the size of the frame 10. If the frame 10 formed by the plastic material has an actual size that is larger than the predetermined size, the deformation grooves 13 can be inwardly narrowed by other components (not shown) of the electronic device, thus tightly holding the glass sheet 20.

It should be appreciated that the frame 10 can be of other shapes, such as hexagonal. In addition, the frame 10 may define one or more deformation grooves 13. The frame 10 may include only the positioning portion 11, in the inner surface of which the deformation grooves 13 are defined.

Figure 4:
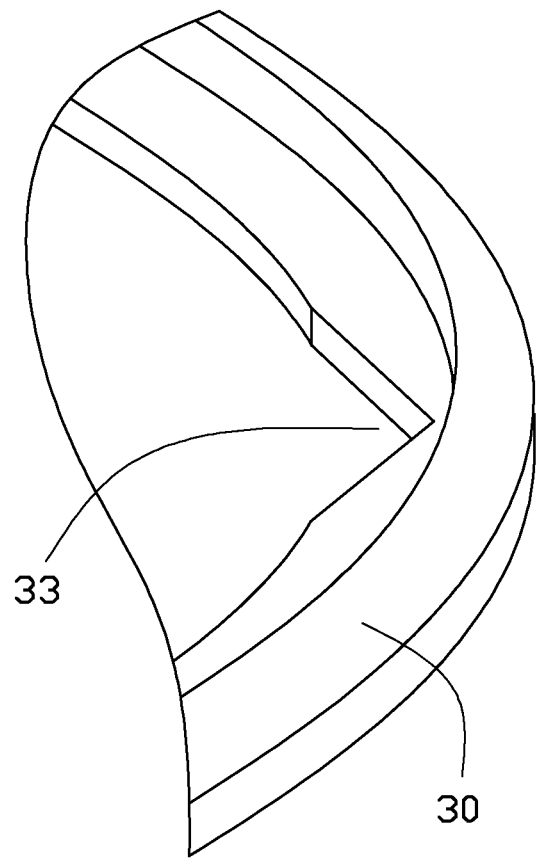
FIG. 4 is a partial, isometric view of a second embodiment of the electronic device frame.

Referring to FIG. 4, a second embodiment of a frame 30 of the electronic device differs from the frame 10 of the first embodiment in that the deformation grooves 33 are triangular, although the deformation grooves 33 of other shapes such as rectangular are equally applicable.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A frame of an electronic device, comprising:
a closed frame, and
at least one deformation groove,
wherein the frame is made of plastic material, and comprises a positioning portion surrounding the electronic device and a support portion extending from a bottom part of an inner surface of the positioning portion for supporting the electronic device; the positioning portion has an opening defined through a center thereof, the support portion comprises a first surface, a second surface opposite to the first surface, and a side surface connecting the first surface and the second surface, the frame defines the at least one deformation groove in at least one corner of the support portion, and the at least one deformation groove is depressed on the side surface in the at least one corner of the support portion, and passes through the first surface and the second surface to be expanded or inwardly narrowed for changing a size of the frame.

2. The frame of claim 1, wherein the frame is substantially rectangular.

3. The frame of claim 1, wherein an outer surface of the positioning portion forms an angled surface.

4. The frame of claim 1, wherein the at least one deformation groove is a curved groove.

5. The frame of claim 1, wherein the at least one deformation groove is a triangular groove.

* * * * *